US007365486B2

United States Patent
Lee et al.

(10) Patent No.: US 7,365,486 B2
(45) Date of Patent: Apr. 29, 2008

(54) HIGH CONTRAST ORGANIC LIGHT EMITTING DEVICE WITH ELECTRON TRANSPORT LAYER INCLUDING FULLERENES

(75) Inventors: Shi-Hao Lee, Banciao (TW); Chung-Wen Ko, Sijhih (TW)

(73) Assignee: AU Optronics Corporation, Hsin-Chu (TW)

( * ) Notice: Subject to any disclaimer, the term of this patent is extended or adjusted under 35 U.S.C. 154(b) by 67 days.

(21) Appl. No.: 10/888,336

(22) Filed: Jul. 9, 2004

(65) Prior Publication Data

US 2006/0006796 A1  Jan. 12, 2006

(51) Int. Cl.
H05B 33/20 (2006.01)
H05B 33/14 (2006.01)
H01L 51/50 (2006.01)

(52) U.S. Cl. .............. 313/504; 313/506; 428/690; 428/917

(58) Field of Classification Search ........... 313/504
See application file for complete search history.

(56) References Cited

U.S. PATENT DOCUMENTS

| 5,049,780 | A | 9/1991 | Dobrowolski et al. ...... 313/509 |
| 5,084,650 | A | 1/1992 | Ryu .......................... 313/507 |
| 5,757,127 | A | 5/1998 | Inoguchi et al. ............ 313/507 |
| 5,986,401 | A | 11/1999 | Thompson et al. ......... 313/504 |
| 6,013,384 | A | 1/2000 | Kido et al. |
| 6,129,980 | A | 10/2000 | Tsukada et al. ............. 428/327 |
| 6,137,223 | A | 10/2000 | Hung et al. |
| 6,185,032 | B1 | 2/2001 | Lee et al. .................... 359/254 |
| 6,307,528 | B1 | 10/2001 | Yap ............................. 345/45 |
| 6,429,451 | B1 | 8/2002 | Hung et al. .................. 257/40 |
| 6,509,109 | B1 * | 1/2003 | Nakamura et al. .......... 428/690 |
| 6,545,409 | B2 | 4/2003 | Kahen |
| 6,558,820 | B2 | 5/2003 | Raychaudhueri et al. ... 428/690 |
| 6,579,629 | B1 | 6/2003 | Raychaudhuri et al. |
| 6,720,092 | B2 * | 4/2004 | Hatwar ........................ 428/690 |
| 2004/0214037 | A1 * | 10/2004 | Roberts et al. ............. 428/690 |
| 2004/0245917 | A1 * | 12/2004 | Lu et al. ...................... 313/503 |

OTHER PUBLICATIONS

O. Renault et al., "A Low Reflectivity Multilayer Cathode for Organic Light-Emitting Diodes," Thin Solid Films, 2000, pp. 195-198, vol. 379, Elsevier Science.

* cited by examiner

Primary Examiner—Nimeshkumar D. Patel
Assistant Examiner—Anne M Hines
(74) Attorney, Agent, or Firm—Duane Morris LLP

(57) ABSTRACT

A high contrast organic light-emitting device (OLED) includes a composite electron transport layer including a generally transparent electron transport layer and a light-absorbent electron transport layer formed of buckminsterfullerene. The light-absorbent electron transport layer absorbs environmental light and the OLED provides an undistorted display with high contrast. The light-absorbent electron transport layer may be disposed directly between the generally transparent electron transport layer which may be formed of Alq, and an LiF electron injection layer of a metallic cathode.

17 Claims, 2 Drawing Sheets

HIGH CONTRAST ORGANIC LIGHT EMITTING DEVICE WITH ELECTRON TRANSPORT LAYER INCLUDING FULLERENES

FIELD OF THE INVENTION

The present invention relates to organic electroluminescent displays, and more particularly to high contrast electroluminescent displays comprising a light-absorbing layer.

BACKGROUND

Organic light-emitting devices (OLEDs), for example organic light emitting diodes, are broadly researched and utilized for their application in flat-panel displays. Flat-panel displays employing organic light-emitting devices are brighter than liquid crystal displays (LCDs) because organic light-emitting devices can emit light themselves and do not require backlight systems. Additionally, with different organic materials, organic light-emitting devices can emit light in red, green and blue colors with high luminescence efficiency. Moreover, organic light-emitting devices can operate with low driving voltages and are viewable from oblique angles.

Organic light-emitting devices are usually structured to have a plurality of layers, including a composite organic interlayer that includes an emissive layer, sandwiched between an anode and cathode. The OLED typically includes a transparent electrode, the anode, disposed between the organic interlayer and a transparent substrate, enabling the emissive layer to provide an illuminated display viewable through the substrate. A metallic cathode is typically arranged behind the organic interlayer and a critical aspect of an OLED is that good contact between the cathode and the organic interlayer is ensured. When light from the environment enters the display device, it travels through the transparent layers and reflects off the metallic cathode. The reflected light distorts the light illuminated by the emissive layer. Therefore, there has been an effort to develop high contrast light emitting devices that absorb rather than reflect environmental light.

Many approaches have been taken to address the problem of distortion as a result of reflection of environmental light. Many of these approaches, however, require an additional apparatus and considerably increased costs. For example, adding a lens outside the OLED has been tried. Another approach has been to form the cathode as a black electrode that includes a layer of carbon. Such an electrode absorbs light and reduces problems that arise from reflection. Adding a layer of carbon to the cathode, however, undesirably creates a cross voltage drop between the cathode and the electron transport layer, typically TAZ, 1,2,4-triazole and causes power levels to rise undesirably. The carbon layer also provides inferior contact between the cathode and the adjacent electron transport layer. To alleviate these problems, a layer of magnesium, Mg, must be added as part of the cathode between the black electrode and the TAZ electron transport layer. The addition of the Mg layer between the carbon and organic layers enhances carrier injection by energy level matching of the Mg and organic materials. The layer of Mg is typically formed using deposition processes that differ from these used to form the organic interlayer. As such, forming a three-layer cathode to include a layer of magnesium, in order to accommodate the cathode further including a layer of carbon is undesirable and costly as it reduces throughput and renders the fabrication process unsuitable for mass production use.

It would be therefore desirable to produce a high contrast organic light emitting device with a light absorbing layer that absorbs environmental light, produces a distortion-free display, is compatible with other materials used to form the device and does not engender an undesirably high power consumption. In particular, it would be desirable to produce such a device that doesn't require a carbon black cathode that is a part of a multiple layered cathode that further includes a magnesium layer.

SUMMARY OF THE INVENTION

To address these objects and in view of its purposes, the present invention provides a high contrast organic electroluminescent device comprising a substrate, a first electrode disposed adjacent to the substrate, a second electrode, and an organic interlayer structure disposed between the electrodes. The organic interlayer structure comprises a light emissive layer and a composite electron transport layer that comprises a transparent electron transport layer and a light-absorbent electron transport layer. transport layer.

In another embodiment, the present invention provides a high contrast organic light emitting device comprising a substrate, a first electrode disposed over the substrate, and a composite organic interlayer disposed over the first electrode. The composite organic interlayer comprises an electroluminescent layer and a composite electron transport layer comprising a first electron transport layer and a second, light-absorbing electron transport layer comprising fullerene. A second electrode is disposed over the composite organic interlayer.

BRIEF DESCRIPTION OF THE DRAWING

The present invention is best understood from the following detailed description when read in conjunction of the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing. Included in the drawing are the following figures.

DETAILED DESCRIPTION

Figure 1:
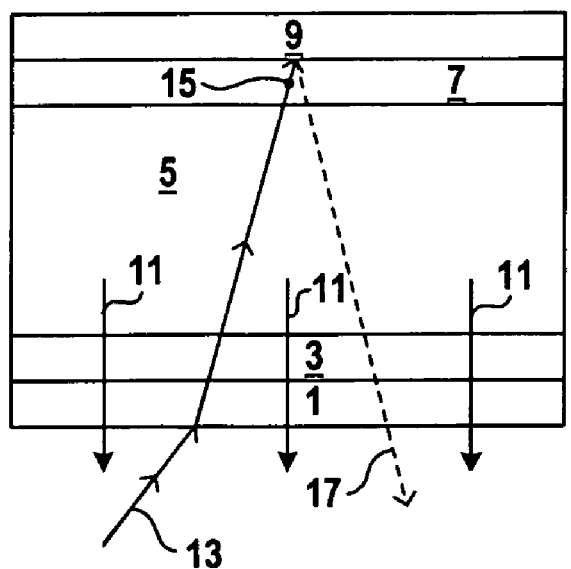
FIG. 1 is a cross-sectional view showing an exemplary OLED of the present invention emitting and absorbing light.

FIG. 1 shows an exemplary high contrast organic light-emitting device according to the present invention. The organic light-emitting device comprises substrate 1, a first electrode—anode 3, organic light-emitting interlayer structure 5 comprising black electron transport layer 7, and a second electrode—cathode 9. According to one exemplary embodiment in which substrate 1 is transparent and anode 3 is transparent, organic light-emitting interlayer structure 5 emits light 11 that is visible through anode 3 and substrate 1, to produce a display. Environmental light 13 enters the OLED through a transparent one of anode 3 and second electrode 9. The environmental light may be outdoor light such as sunlight or other ambient light from the environment. In the illustrated embodiment of FIG. 1, environmental light 13 enters the OLED through transparent substrate 1 and transparent anode 3. In another exemplary embodiment (not shown in FIG. 1), organic light-emitting interlayer structure 5 emits light through a transparent cathode 9 and in that embodiment, substrate 1 may be opaque and environmental light will also enter through transparent cathode 9. It is desirable to prevent the environmental light from reflecting off of a component of the OLED such as the cathode 9 which may be a metallic cathode in the embodiment of FIG. 1, because the reflected light mixes with and thereby distorts emitted light 11 produced by the OLED. Black electron transport layer, hereinafter BETL 7, prevents or at least severely restricts such reflection by absorbing the environmental light such as indicated at absorption point 15. Because BETL 7 absorbs most or all of environmental light 13, little or no incoming environmental light 13 reflects off of cathode 9 as reflected light 17, indicated as a dashed arrow. In one exemplary embodiment, all of environmental light 13 is absorbed and reflected light 17 is not present.

FIG. 1 shows an OLED of the present invention that is a bottom-emitting OLED, i.e. an OLED that emits light through anode 3 and substrate 1, both of which may be transparent. According to another embodiment, the OLED of the present invention may be a top-emitting OLED and may emit light in the opposite direction i.e. opposite the substrate, and through a cathode that is transparent. The following detailed description is in conjunction with the exemplary bottom-emitting OLED 100 shown in FIG. 2, but it should be understood that the composite electron transport layer of the present invention might be used in conjunction with a top emitting OLED, such as will be shown in FIG. 3.

Figure 2:
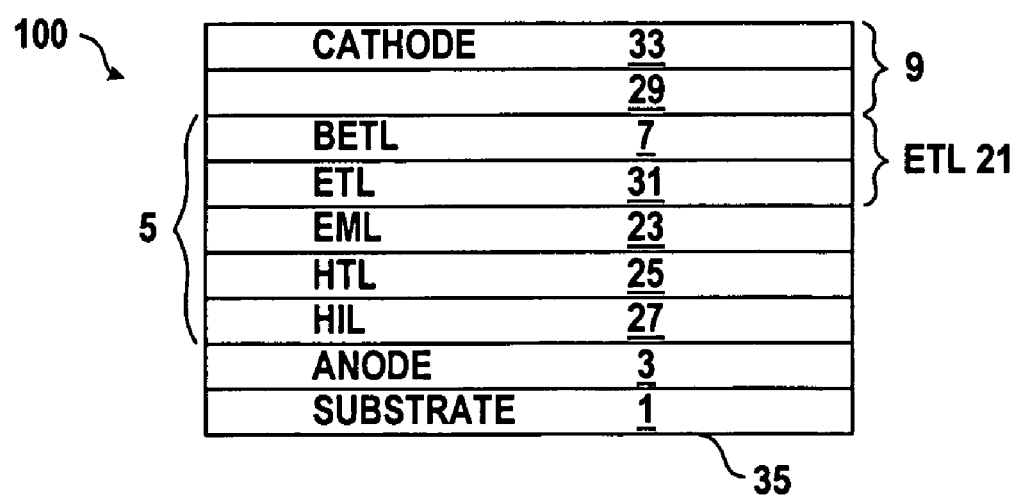
FIG. 2 is a cross-sectional view showing one exemplary OLED of the present invention in further detail.

FIG. 2 shows further details of one exemplary embodiment of an OLED such as shown in FIG. 1. FIG. 2 shows exemplary bottom-emitting OLED 100 comprising substrate 1, anode 3, organic light-emitting interlayer structure 5, and cathode 9 which includes electron injection layer 29 and metal layer 33 in the illustrated embodiment. Organic light-emitting interlayer structure 5 is a composite structure and includes composite electron transport layer ETL 21, emissive layer EML 23, hole transport layer HTL 25 and hole injection layer HIL 27. Composite electron transport layer ETL 21 includes black electron transport layer BETL 7 and further electron transport layer 31 which is advantageously a transparent electron transport layer and forms a conterminous boundary with BETL 7.

According to the embodiment in which OLED 100 is a bottom-emitting OLED such as illustrated in FIG. 2, substrate 1 may be formed of glass, quartz, plastics or other suitable transparent, i.e., light transmissive, materials. Anode 3 may be formed of ITO, indium tin oxide, in one embodiment. ITO forms an efficient anode because it has a relatively high work function and is transparent. Other suitable anode materials include other high work function metals or alloys of such metals. Porphorinic or pthalocyanine compounds such as copper pthalocyanine, CuPc may be used as hole injection layer 27 but other suitable materials may also be used in other exemplary embodiments. Various materials may be used for hole transport layer 25. Aromatic amines such as NPB (4,4' Bis [N-(1-naphthyl)-N-phenylamino] biphenyl) are particularly favored. Light emission is produced in emissive layer 23 as a result of the recombination of holes and electrons, and may be formed of various commercially available materials. Various base materials and various dyes may be used to produce various light colors. In one exemplary embodiment, 9,10-di-(2-naphthyl) anthracene dopant may be used to produce blue light. Other electroluminescent materials and dyes may be used in other exemplary embodiments.

Desirable cathode materials have good film-forming properties to ensure good contact with the underlying organic layer, promote electron injection at low voltage, and have good stability. In the bottom-emitting embodiment of FIG. 2, cathode 9 may be opaque. One exemplary cathode 9 embodiment includes a thin electron-injection layer 29 in contact with organic light-emitting interlayer structure 5 (e.g., ETL 21) and capped with a thicker layer of a metal layer 33. The thickness of electron-injection layer 29 may be in the vicinity of 10 angstroms with the thickness of metal layer 33 being in the hundreds or thousands of angstroms, in one exemplary embodiment. Other thicknesses and relative thicknesses may be used in other exemplary embodiments. The thin electron injection layer 29 may include a low work function metal (<4.0 eV) or metal salt which means the thicker metal layer 33 is not required to have a low work function. In one embodiment, electron injection layer 29 may be formed of an alkaline halide such as LiF. Metal layer 33 may be formed of aluminum or other reflective metals suitable for use as electrodes. The BETL 7 of the present invention may therefore be formed directly adjacent cathode 9, in particular, adjacent electron-injection layer 29 of cathode 9, as illustrated in FIG. 2.

Organic light-emitting interlayer structure 5 includes composite electron transport layer 21 that includes BETL 7 and further electron transport layer 31. BETL 7 is advantageously formed closer to the non-transparent electrode, cathode 9, than further electron transport layer 31 which may be formed of Alq (tris(8-hydroxyquinoline) aluminum) in an exemplary embodiment. Other suitable electron transport materials may be used in other exemplary embodiments. Further electron transport layer 31 may be a light transmissive material such that environmental light that enters OLED 100 through surface 35 of substrate 1 and as shown in FIG. 1, environmental light 13 may pass through further electron transport layer 31 prior to being absorbed in BETL 7.

Black electron transport layer 7 is a generally light-absorbent material and may advantageously be formed to a thickness ranging from 100 to 2000 angstroms in one exemplary embodiment, and 100-300 angstroms in one particular exemplary embodiment but other thicknesses may be used in other exemplary embodiments. Black electron transport layer 7 may advantageously be a fullerene such as buckminsterfullerene, $C_{60}$, but other fullerenes such as $C_{70}$, $C_{76}$, $C_{78}$, $C_{82}$, $C_{84}$, $C_{90}$ and $C_{96}$ may be used in other exemplary embodiments. The fullerenes are closed steroidal aromatic molecules with even numbers of carbons. The use of fullerenes such as $C_{60}$ fullerene as an electron transport layer, negates the need to add a layer of magnesium to suppress a cross-voltage drop between a black electrode and the organic interlayer structure, such as is the case in prior art arrangements. Furthermore, the electron transport layer BETL 7 is compatible with, and adheres well to, cathode 9. In one embodiment, BETL 7 is interposed directly between electron-injection layer 29 formed of LiF and further electron transport layer 31 formed of Alq. BETL 7 may advantageously be formed using the same film formation techniques used to form the other organic layers of the OLED of the invention. In one embodiment, some of the same source gasses may be used. Various vapor deposition techniques such as CVD, chemical vapor deposition, or PVD, physical vapor deposition, may be used to form BETL 7 and the other layers of organic light-emitting interlayer structure 5, but other film formation methods may be used in other exemplary embodiments.

The high contrast organic electroluminescent display device formed to include BETL 7 exhibits enhanced performance characteristics. In particular, the addition of BETL 7 increases the contrast ratio of the OLED display as the thickness of BETL layer 7 increases from 0 to 300 angstroms. Reflectivity decreases as thickness of BETL layer 7 increases. Advantageously, as the thickness of BETL 7 increases, the current used in operating the device remains steadily below 25 J/cm$^2$ and the drive voltage shows no noticeable rise as BETL 7 thickness increases from 0 to 300 angstroms, according to a particular embodiment of the OLED shown in FIG. 2, in which transparent anode 3 is formed of ITO, HTL 25 is formed of NPB, EML 23 includes 9,10-di-(2-naphthyl) anthracene dopant, ETL 21 is formed of Alq, BETL 7 is formed of buckminsterfullerene, electron injection layer 29 is formed of LiF and cathode 9 is formed of aluminum.

The exemplary OLED shown in FIG. 2 and described in conjunction with FIG. 2 is a bottom-emitting OLED in which substrate 1 and anode 3 are transparent and the OLED emits light through anode 3 and substrate 1. Also in this embodiment, environmental light enters the OLED through substrate 1 and anode 3 and reflects off of second electrode 9 which is a cathode and is formed of a reflective material.

Figure 3:
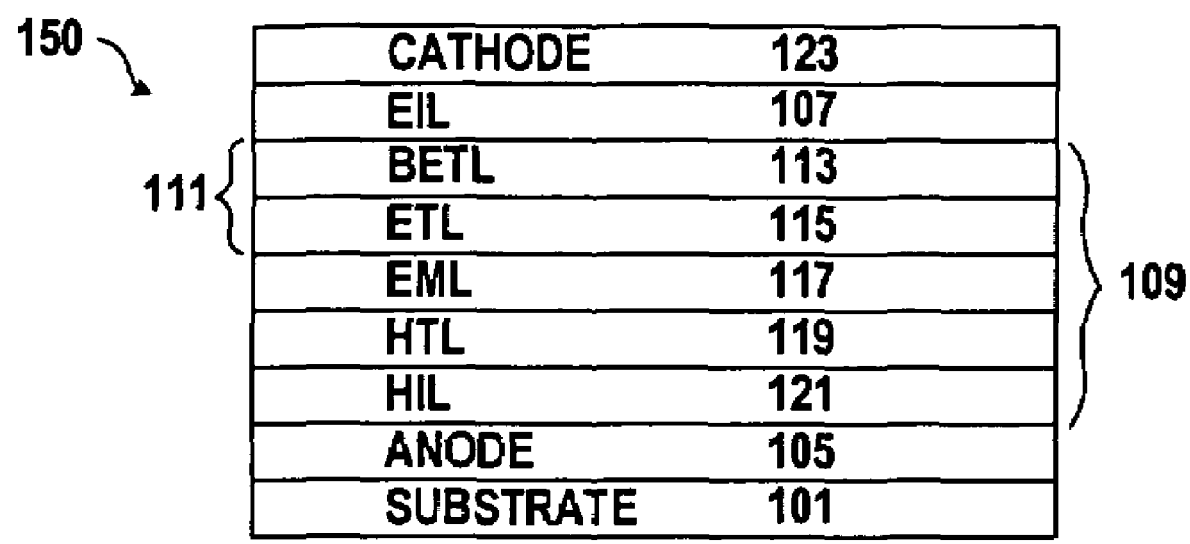
FIG. 3 is a cross-sectional view showing another exemplary OLED of the present invention in further detail.

In another exemplary embodiment shown in FIG. 3, the OLED may be a top-emitting OLED. Exemplary top-emitting OLED 150 is shown in FIG. 3 and includes substrate 101, anode 105, either or both of which may be opaque, organic light-emitting interlayer structure 109, electron injection layer 107 and cathode 123. Organic light-emitting interlayer structure 109 includes electron transfer layer 111 formed of black electron transport layer (BETL) 113 and further electron transport layer 115. Organic light-emitting interlayer structure 109 also includes emissive layer 117, hole transport layer 119 and hole injection layer 121. Cathode 123 is formed of a transparent material in this embodiment and the OLED emits light through cathode 123. Environmental light also enters the OLED through cathode 123. It can be seen that black electron transfer layer 113 is adjacent the electron injection layer 107, to absorb environmental incident from cathode 123. Top-emitting OLED 150 shown in FIG. 3 operates according to the same principles as the bottom-emitting exemplary OLED of FIG. 2. BETL 113 is chosen to allow light emitted by emissive layer 117 to pass therethrough. The top-emitting embodiment also enjoys enhanced performance including an increased contrast ratio compared to conventional OLED's.

The preceding merely illustrates the principles of the invention. It will thus be appreciated that those skilled in the art will be able to devise various further arrangements not explicitly described or shown herein, that embody the principles of the invention and are included within its spirit and scope.

All examples and conditional language recited herein are principally intended expressly to be only for pedagogical purposes and to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical,", "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. For example, although FIGS. 1 and 2 illustrate substrate 1 being at the bottom of the OLED structure, the structures shown in FIGS. 1 and 2 may be inverted for descriptive purposes. Similarly, since the viewer of the display produced by OLED 100 views the display through the substrate, the substrate is generally considered the front according to that perspective. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A high contrast organic electroluminescent device comprising a substrate, a first electrode disposed adjacent to said substrate, a second electrode, and an organic interlayer structure disposed between said electrodes, said organic interlayer structure comprising a light emissive layer and a composite electron transport layer comprising a transparent electron transport layer consisting of Alq and a light-absorbent electron transport layer formed of fullerene, said light-absorbent electron transport layer disposed between said transparent electron transport layer and said second electrode.

wherein said second electrode is a cathode, said light-absorbent electron transport layer is formed directly adjacent said cathode and said fullerene comprises one of fullerenes C76, C78, C82, C84, C90 and C96.

2. The high contrast organic electroluminescent device as in claim 1, wherein one of said first electrode and said second electrode includes an LiF layer.

3. The high contrast organic electroluminescent device as in claim 1, wherein said light-absorbent electron transport layer is conterminous with said transparent electron transport layer.

4. The high contrast organic electroluminescent device as in claim 1, wherein said organic interlayer structure further comprises a hole injection layer and a hole transport layer.

5. The high contrast organic electroluminescent device as in claim 4, wherein said hole transport layer is formed of NPB.

6. The high contrast organic electroluminescent device as in claim 4, wherein said emissive layer includes 9,10-di-(2-naphthyl) anthracene-blue dopant.

7. The high contrast organic electroluminescent device as in claim 4, wherein said hole injection layer is disposed next to and in contact with said first electrode, said hole transport layer is disposed next to and in contact with said hole injection layer, said light emissive layer is disposed next to and in contact with said hole transport layer, said transparent electron transport layer is disposed next to and in contact with said light emissive layer, said light-absorbent electron transport layer is disposed next to and in contact with said transparent electron transport layer, an LiF layer of said second electrode is disposed next to and in contact with said light-absorbent electron transport layer, and a metallic layer of said second electrode is disposed next to and in contact with said LiF layer of said second electrode.

8. The high contrast organic electroluminescent device as in claim 1, wherein said light-absorbent electron transport layer absorbs environmental light that enters said device through a transparent one of said first electrode and said second electrode.

9. The high contrast organic electroluminescent device as in claim 1, wherein said substrate and said first electrode are transparent and said cathode is a metallic material.

10. The high contrast organic electroluminescent device as in claim 1, in which said light-absorbent electron transport layer includes a thickness within a range of 100-2000 angstroms.

11. The high contrast organic electroluminescent device as in claim 1, wherein said cathode includes an electron injection layer directly adjacent said light-absorbent electron transport layer.

12. A high contrast organic light emitting device comprising a substrate, a first electrode disposed over said substrate, a composite organic interlayer disposed over said first electrode, said composite organic interlayer including an electroluminescent layer and a composite electron transport layer including a first electron transport layer consisting of Alq and a second, light absorbing electron transport layer formed of fullerene and having a thickness within a range of 100-2000 angstroms, and a second electrode disposed over said composite organic interlayer and directly adjacent to said light absorbing electron transport layer, said second electrode comprising a cathode, wherein said light absorbing electron transport layer is formed of one of fullerenes C76, C78, C82, C84, C90 and C96.

13. The high contrast organic light emitting device as in claim 12, wherein said second electrode includes an electron injection layer formed of LiF and that is directly adjacent said second, light absorbing electron transport layer.

14. The high contrast organic light emitting device as in claim 12, wherein said substrate is transparent and said electroluminescent layer emits light viewable through said substrate.

15. The high contrast organic light emitting device as in claim 12, wherein said second, light absorbing electron transport layer is disposed directly on said first electron transport layer.

16. A high contrast organic electroluminescent device comprising a substrate, an anode disposed adjacent to said substrate, a cathode, and an organic interlayer structure disposed between said anode and cathode, said organic interlayer structure comprising a light emissive layer and a composite electron transport layer comprising a transparent electron transport layer consisting of Alq and a light-absorbent electron transport layer formed of fullerene, said light-absorbent electron transport layer disposed directly between said transparent electron transport layer and said cathode, wherein said fullerene comprises one of fullerenes C76, C78, C82, C84, C90 and C96.

17. The high contrast organic electroluminescent device as in claim 16, wherein said light-absorbent electron transport layer has a thickness within a range of 100-2000 angstroms.

* * * * *